(12) United States Patent
Kang et al.

(10) Patent No.: US 9,905,645 B2
(45) Date of Patent: Feb. 27, 2018

(54) VERTICAL FIELD EFFECT TRANSISTOR HAVING AN ELONGATED CHANNEL

(71) Applicant: SAMSUNG ELECTRONICS CO., LTD., Suwon-si, Gyeonggi-Do (KR)

(72) Inventors: Myung Gil Kang, Cohoes, NY (US); Seung Han Park, Albany, NY (US); Yong Hee Park, Cohoes, NY (US); Sang Hoon Baek, Schenectady, NY (US); Sang Woo Lee, Albany, NY (US); Keon Yong Cheon, Albany, NY (US); Sung Man Whang, Fishkill, NY (US)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/256,136

(22) Filed: Sep. 2, 2016

(65) Prior Publication Data

US 2017/0345897 A1 Nov. 30, 2017

Related U.S. Application Data

(60) Provisional application No. 62/340,857, filed on May 24, 2016.

(51) Int. Cl.
*H01L 21/336* (2006.01)
*H01L 29/778* (2006.01)
(Continued)

(52) U.S. Cl.
CPC .... *H01L 29/0847* (2013.01); *H01L 29/41741* (2013.01); *H01L 29/41758* (2013.01);
(Continued)

(58) Field of Classification Search
CPC .......... H01L 29/0847; H01L 29/42376; H01L 29/41758; H01L 29/7851; H01L 29/41741; H01L 29/7827
(Continued)

(56) References Cited

U.S. PATENT DOCUMENTS 7,230,286 B2 6/2007 Cohen
7,514,325 B2 * 4/2009 Kim .................. H01L 29/42392
257/213
(Continued)

FOREIGN PATENT DOCUMENTS

WO WO 2005/079182 9/2005

*Primary Examiner* — Marc Armand
*Assistant Examiner* — Nelson Garces
(74) *Attorney, Agent, or Firm* — F. Chau & Associates, LLC

(57) ABSTRACT

A vertical field effect transistor is provided as follows. A substrate has a lower drain and a lower source arranged along a first direction in parallel to an upper surface of the substrate. A fin structure is disposed on the substrate and extended vertically from the upper surface of the substrate. The fin structure includes a first end portion and a second end portion arranged along the first direction. A bottom surface of a first end portion of the fin structure and a bottom surface of a second end portion of the fin structure overlap the lower drain and the lower source, respectively. The fin structure includes a sidewall having a lower sidewall region, a center sidewall region and an upper sidewall region. A gate electrode surrounds the center side sidewall region of the fin structure.

15 Claims, 19 Drawing Sheets

(51) Int. Cl.
*H01L 29/78* (2006.01)
*H01L 29/08* (2006.01)
*H01L 29/423* (2006.01)
*H01L 29/417* (2006.01)

(52) U.S. Cl.
CPC .... *H01L 29/42376* (2013.01); *H01L 29/7827* (2013.01); *H01L 29/7851* (2013.01)

(58) Field of Classification Search
USPC ....................................................... 257/329
See application file for complete search history.

(56) References Cited

U.S. PATENT DOCUMENTS

| | | | |
|---|---|---|---|
| 7,683,428 B2 | 3/2010 | Chidambarrao et al. | |
| 7,892,956 B2 | 2/2011 | Deligianni et al. | |
| 8,378,425 B2 | 2/2013 | Masuoka et al. | |
| 8,466,017 B2 | 6/2013 | Sheridan et al. | |
| 8,502,303 B2* | 8/2013 | Masuoka | H01L 21/26586 257/327 |
| 9,064,739 B2 | 6/2015 | Haensch et al. | |
| 9,209,248 B2 | 12/2015 | Tegen | |
| 9,224,837 B2 | 12/2015 | Anderson et al. | |
| 2008/0073667 A1* | 3/2008 | Lochtefeld | H01L 29/66795 257/190 |
| 2013/0023095 A1* | 1/2013 | Nojima | H01L 29/66666 438/268 |
| 2013/0134507 A1 | 5/2013 | Takaishi | |
| 2015/0171032 A1* | 6/2015 | Colinge | H01L 23/60 257/355 |
| 2015/0236086 A1 | 8/2015 | Colinge et al. | |
| 2015/0287821 A1* | 10/2015 | Masuoka | H01L 21/823885 257/329 |
| 2015/0318282 A1 | 11/2015 | Rodder et al. | |
| 2015/0380548 A1* | 12/2015 | Wang | H01L 29/7827 257/329 |
| 2016/0093745 A1* | 3/2016 | Diaz | H01L 29/78696 257/29 |

\* cited by examiner

FIG. 14
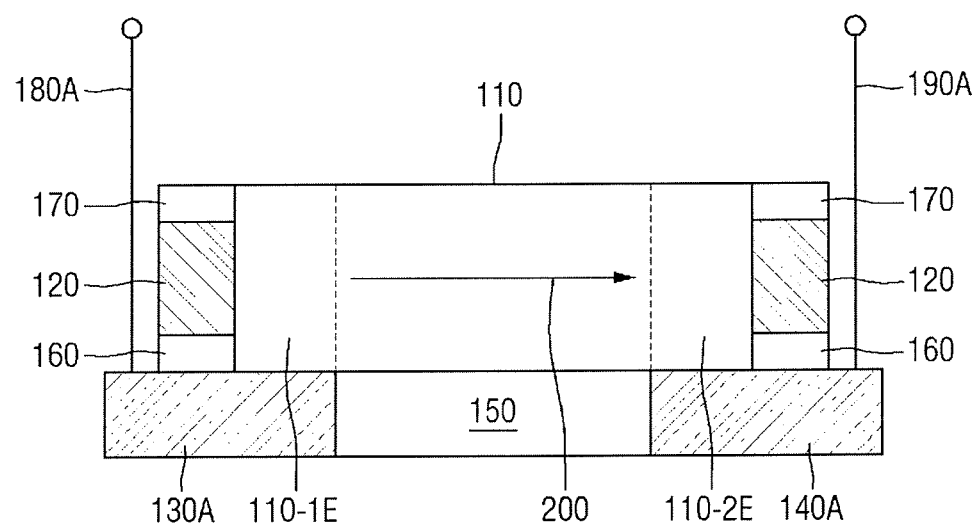
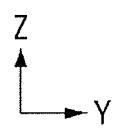

VERTICAL FIELD EFFECT TRANSISTOR HAVING AN ELONGATED CHANNEL

CROSS-REFERENCE TO RELATED APPLICATION

This application claims the benefit under 35 U.S.C. § 119(e) to U.S. Provisional Patent Application No. 62/340,857, filed on May 24, 2016 in the United States Patent & Trademark Office, the disclosure of which is incorporated by reference herein in its entirety.

TECHNICAL FIELD

The present inventive concept relates to a vertical fin field effect transistor.

DISCUSSION OF RELATED ART

Transistors have been planar. As the transistors shrink, leakage current increases, draining batteries and heating up semiconductor chips. To reduce the leakage current, various transistor structures have been proposed.

SUMMARY

According to an exemplary embodiment of the present inventive concept, a vertical field effect transistor is provided as follows. A substrate has a lower drain and a lower source arranged along a first direction in parallel to an upper surface of the substrate. A fin structure is disposed on the substrate and extended vertically from the upper surface of the substrate. The fin structure includes a first end portion and a second end portion arranged along the first direction. A bottom surface of a first end portion of the fin structure and a bottom surface of a second end portion of the fin structure overlap the lower drain and the lower source, respectively. The fin structure includes a sidewall having a lower sidewall region, a center sidewall region and an upper sidewall region. A gate electrode surrounds the center side sidewall region of the fin structure.

According to an exemplary embodiment, a vertical field effect transistor is provided as follows. A fin structure is disposed on a substrate. The fin structure includes a first end portion and a second end portion arranged along a first direction in parallel to an upper surface of the substrate. The fin structure is extended vertically from the upper surface of the substrate and includes a sidewall having a lower sidewall region, a center sidewall region and an upper sidewall region. An upper drain is disposed on an upper surface of the first end portion of the fin structure. An upper source is disposed on an upper surface of the second end portion of the fin structure. A gate electrode surrounds the center side sidewall region of the fin structure.

According to an exemplary embodiment of the present inventive concept, a vertical field effect transistor is provided as follows. A substrate has a lower drain and a lower source. A fin structure is disposed on the substrate and extended vertically from an upper surface of the substrate. The fin structure includes a sidewall having a lower sidewall region, a center sidewall region and an upper sidewall region. An upper source and an upper drain are disposed on an upper surface of the fin structure. The upper source is overlapped with the lower source. The upper drain is overlapped with the lower drain. A gate electrode surrounds the center side sidewall region of the fin structure. A drain control switch is connected to a main drain electrode as an input and a first sub drain electrode and a second sub drain electrode as outputs. The first and second sub drain electrodes are connected to the lower and upper drains, respectively. A source control switch is connected to a main source electrode as an output and a first sub source electrode and a second sub source electrode as inputs. The first and second sub source electrodes are connected to the lower and upper sources, respectively.

BRIEF DESCRIPTION OF DRAWINGS

These and other features of the present inventive concept will become more apparent by describing in detail exemplary embodiments thereof with reference to the accompanying drawings of which:

FIGS. 14 and 15 show an electrode connection using cross-sectional views taken along lines A-A and B-B of FIG. 1, respectively, according to an exemplary embodiment of the present inventive concept;

Figure 1:
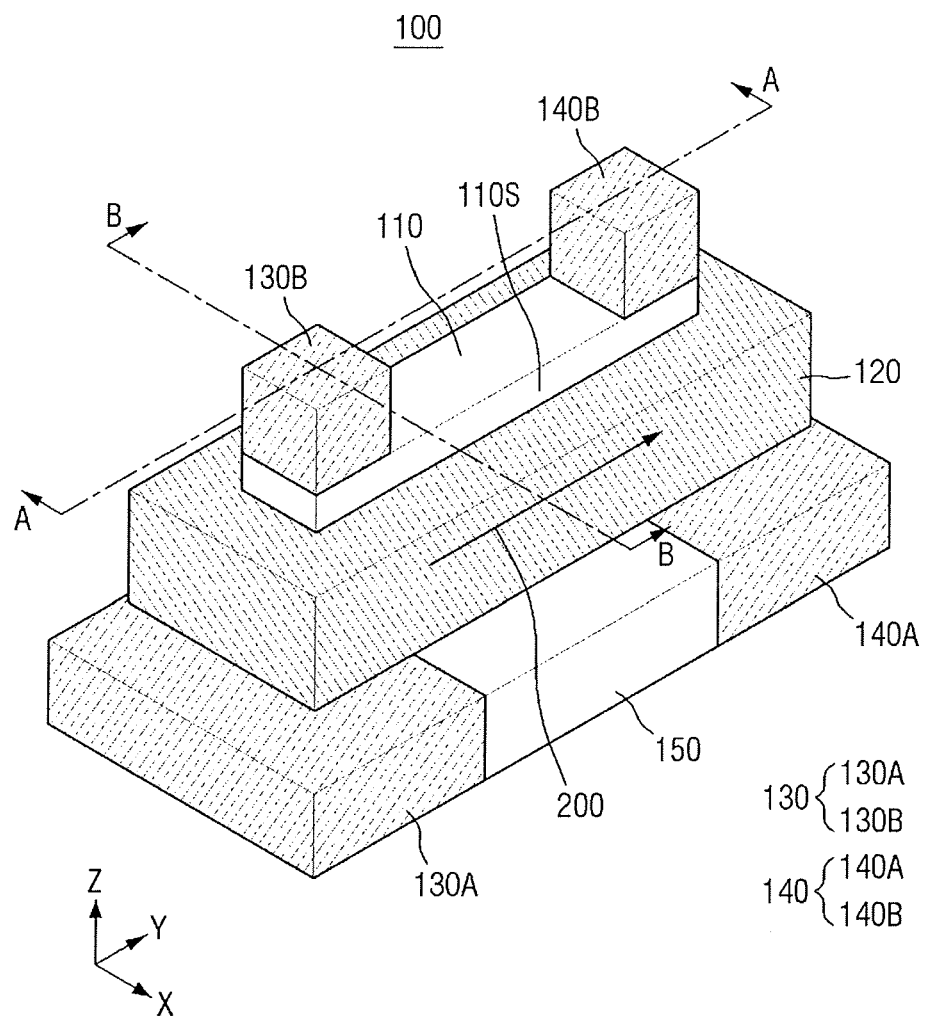
FIG. 1 shows a perspective view of a vertical field effect transistor (V-FinFET) according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Figure 2:
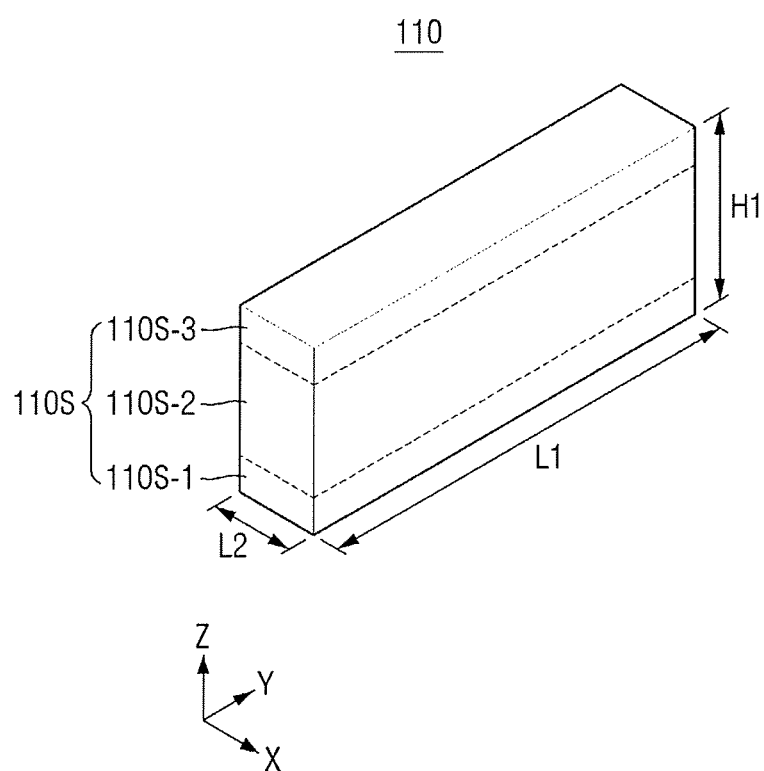
FIG. 2 shows a vertical division of the fin structure according to an exemplary embodiment of the present inventive concept.
Figure 3:
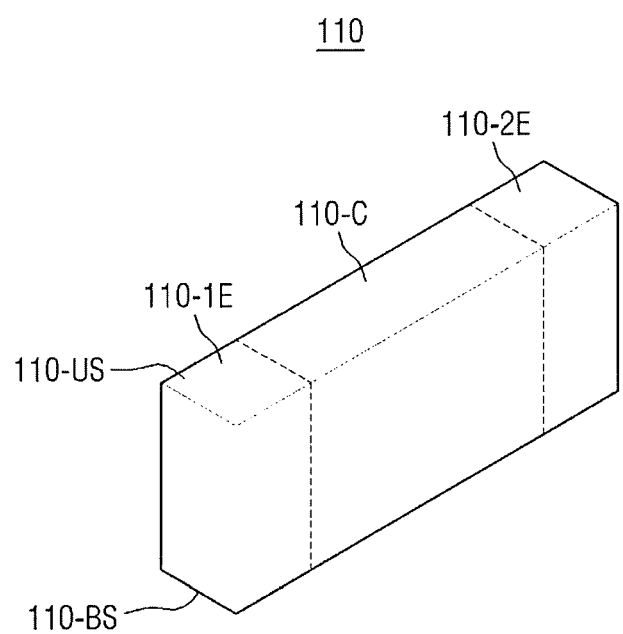
FIG. 3 shows a horizontal division of the fin structure according to an exemplary embodiment of the present inventive concept.

FIG. 1 shows a perspective view of a vertical field effect transistor (V-FinFET) 100 according to an exemplary embodiment of the present inventive concept. The V-FinFET 100 includes a fin structure 110 and a gate electrode 120. FIGS. 2 and 3 show perspective views of the fin structure 110 for the convenience of description. FIG. 2 shows a vertical division of the fin structure 110 according to an exemplary embodiment of the present inventive concept. FIG. 3 shows a horizontal division of the fin structure 110 according to an exemplary embodiment of the present inventive concept. Hereinafter, the description of the V-FinFET 100 will be made with reference to FIGS. 1 to 3.

The fin structure 110 is elongated along a y-direction so that a first length L1 of the fin structure along the y-direction is longer than a second length L2 of the fin structure along the x-direction.

The fin structure 110 is vertically protruded from a substrate 150 along a z-direction so that the fin structure 110 has a height H1. The z-direction is perpendicular to an upper surface of the substrate 150. The upper surface of the substrate is parallel to a surface defined by the x-direction and the y-direction.

The fin structure 110 may be formed of silicon (Si) or an alloy of silicon and germanium (SiGe). The fin structure 110 may be epitaxially grown from the substrate 150 or patterned by etching the substrate 150.

The fin structure 110 includes a sidewall 110S having a lower sidewall region 110S-1, a center sidewall region 110S-2 and an upper sidewall region 110S-3 which are divided along the z-direction.

The fin structure 110 includes a first end portion 110-1E, a second end portion 110-2E and a center portion 110-C which are divided along the y-direction. The center portion 110-C is interposed between the first end portion 110-1E and the second end portion 110-2E.

The gate electrode 120 wraps around the center sidewall region 110S-2 of the fin structure 110. The gate electrode 120 may be formed of a conductive material including a doped polysilicon or metal including tungsten (W) or copper (Cu).

The V-FinFET 100 may include a gate oxide (not shown here) interposed between the gate electrode 120 and the fin structure 110. For the convenience of description, the gate oxide is not shown in FIG. 1.

The V-FinFET 100 includes a first source/drain (S/D) 130 and a second source/drain (S/D) 140 which are overlapped with the first and second end portions 110-1E and 110-1E, respectively.

The first S/D 130 includes a lower first S/D 130A and an upper first S/D 130B. The second S/D 140 includes a lower second S/D 140A and an upper second S/D 140B. The lower first S/D 130A is formed in the substrate 150 so that the lower first S/D 130A is overlapped with the first end portion 110-1E of the fin structure. In an exemplary embodiment, the lower first S/D 130A may be in contact with a bottom surface 110-BS of the first end portion 110-1E of the fin structure 110. The present inventive concept is not limited thereto. For example, a contact layer may be interposed between the first end portion 110-1E of the fin structure 110 and the lower first S/D 130A to reduce a contact resistance.

The lower second S/D 140A is formed in the substrate 150 so that the lower second S/D 140A is overlapped with the second end portion 110-2E of the fin structure 110. In an exemplary embodiment, the lower second S/D 140A may be in contact with a bottom surface 110-BS of the second end portion 110-2E of the fin structure 110. The present inventive concept is not limited thereto. For example, a contact layer may be interposed between the second end portion 110-2E of the fin structure 110 and the lower second S/D 140A to reduce a contact resistance.

The lower first S/D 130A and the second lower S/D 140A are not overlapped with the center portion 110-C of the fin structure 110.

The upper first S/D 130B is disposed on an upper surface 110-US of the first end portion 110-1E of the fin structure 110 so that the upper first S/D 130B is overlapped with the first end portion 110-1E of the fin structure 110. In an exemplary embodiment, the upper first S/D 130B is in contact with the upper surface 110-US of the first end portion 110-1E of the fin structure 110. The present inventive concept is not limited thereto. For example, a contact layer (not shown here) may be interposed between the upper first S/D 130B and the first end portion 10-1E of the fin structure 110.

The upper second S/D 140B is disposed on an upper surface 110-US of the second end portion 110-2E of the fin structure 110 so that the upper second S/D 140B is overlapped with the second end portion 110-2E of the fin structure 110. In an exemplary embodiment, the upper second S/D 140B is in contact with the upper surface 110-US of the second end portion 110-2E of the fin structure 110. The present inventive concept is not limited thereto. For example, a contact layer (not shown here) may be interposed between the upper second S/D 140B and the second end portion 110-2E of the fin structure 110.

At least one of the lower first S/D 130A and the upper first S/D 130B may serve as a drain of the V-FinFET 100, and at least one of the lower second S/D 140A and the upper second S/D 140B may serve as a source of the V-FinFET 100. For the convenience of description, it is assumed that the at least one of the lower first S/D 130A and the upper first S/D 130B serves as a drain and the at least one of the lower second S/D 140A and the upper second S/D 140B serves as a source. In this case, when the V-FinFET 100 turns on, a current 200 flows along a y-direction from the drain through the first and second end portions 110-1E and 110-2E to the source. Between the first end portion 110-1E and the second end portion 110-2E, the current 200 flows along the y-direction perpendicular to the z-direction along which the fin structure is protruded from the substrate 150.

Hereinafter, the lower first S/D 130A may be referred to as a lower drain 130A; the upper first S/D 130B may be referred to as an upper drain 130B; the lower second S/D 140A may be referred to as a lower source 140A; and the upper second S/D 140B may be referred to as an upper source 140B.

The V-FinFET 100 may have various connections of the lower drain 130A, the upper drain 130B, the lower source 140A and the upper drain 140B as described with reference to FIGS. 4 to 15.

Figure 4:
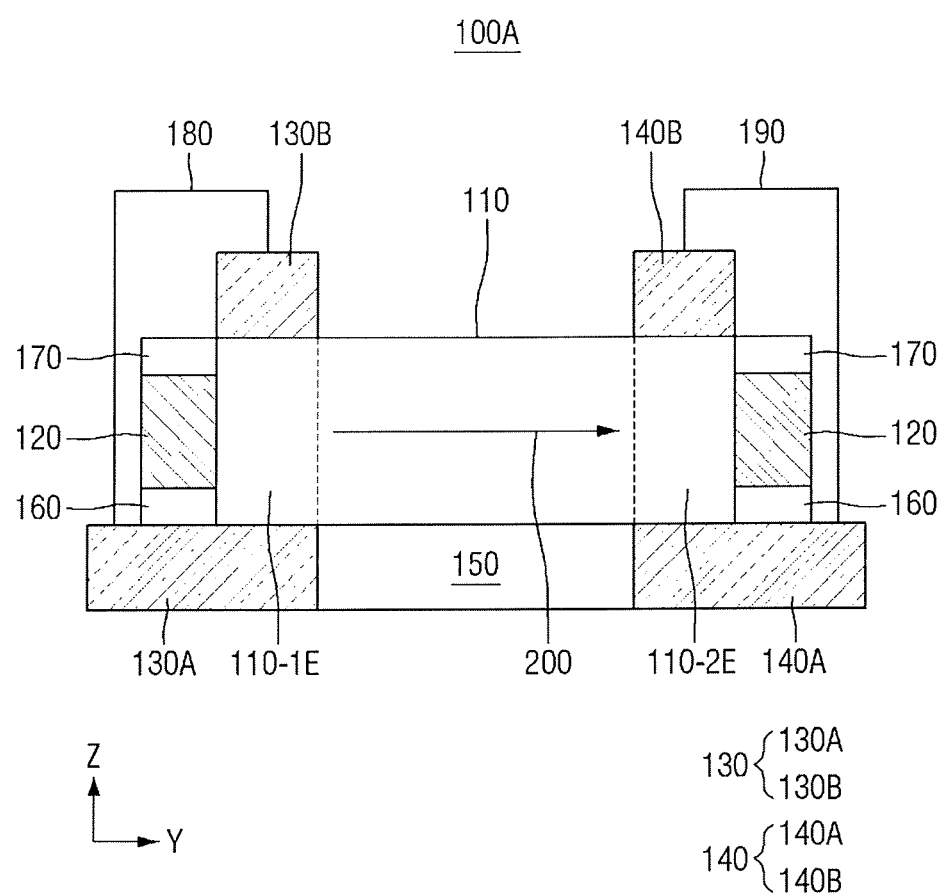
FIGS. 4 and 5 show an electrode connection using cross-sectional views taken along lines A-A and B-B of FIG. 1, respectively, according to an exemplary embodiment of the present inventive concept.
Figure 5:
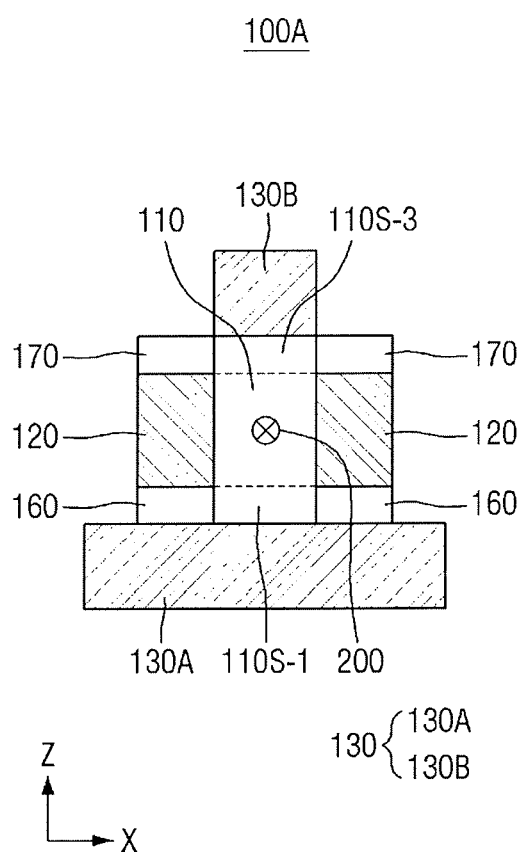

FIGS. 4 and 5 show cross-sectional views of a V-FinFET 100A taken along lines A-A and B-B of FIG. 1 according to an exemplary embodiment of the present inventive concept. When the V-FinFET 100A turns on, a current 200 flows from the drain 130 through the first end portion 110-1E and the second end portion 110-2E to the source 140.

In the V-FinFET 100A, the upper drain 130B and the lower drain 130A are electrically connected to each other using a drain electrode 180; the upper source 140B and the lower source 140A are electrically connected to each other using a source electrode 190.

The V-FinFET 100A further includes a lower spacer 160 and an upper spacer 170 which are not shown in FIG. 1 for the convenience of description. The lower spacer 160 wraps around the lower sidewall region 110S-1 of the fin structure 110 so that the lower spacer 160 is interposed between the lower drain 130A and the gate electrode 120 to prevent an electrical shortage between the lower drain 130A and the gate electrode 120. The lower spacer 160 is also interposed between the lower source 140A and the gate electrode 120 to prevent an electrical shortage between the lower source 140A and the gate electrode 120.

The upper spacer 170 wraps around the upper sidewall region 110S-3 of the fin structure 110 so that the upper spacer 170 is interposed between the upper drain 130B and the gate electrode 120 to prevent an electrical shortage between the upper drain 130B and the gate electrode 120. The upper spacer 170 is also interposed between the upper source 140B and the gate electrode 120 to prevent an electrical shortage between the upper source 140B and the gate electrode 120.

In this case, the lower drain 130A and the upper drain 130B serve as a drain 130 of the V-FinFET 110A; and the lower source 140A and the upper source 140B serve as a source of the V-FinFET 110A.

The lower drain 130A, the lower spacer 160, the gate electrode 120 and the upper spacer 170 are vertically stacked on each other in the listed order.

The lower drain 130A, the first end portion 110-1E of the fin structure 110 and the upper drain 130B are vertically stacked on each other in the listed order.

The lower source 140A, the lower spacer 160, the gate electrode 120 and the upper spacer 170 are vertically stacked on each other in the listed order.

The lower source 140A, the second end portion 110-2E of the fin structure 110 and the upper source 140B are vertically stacked on each other in the listed order.

Figure 6:
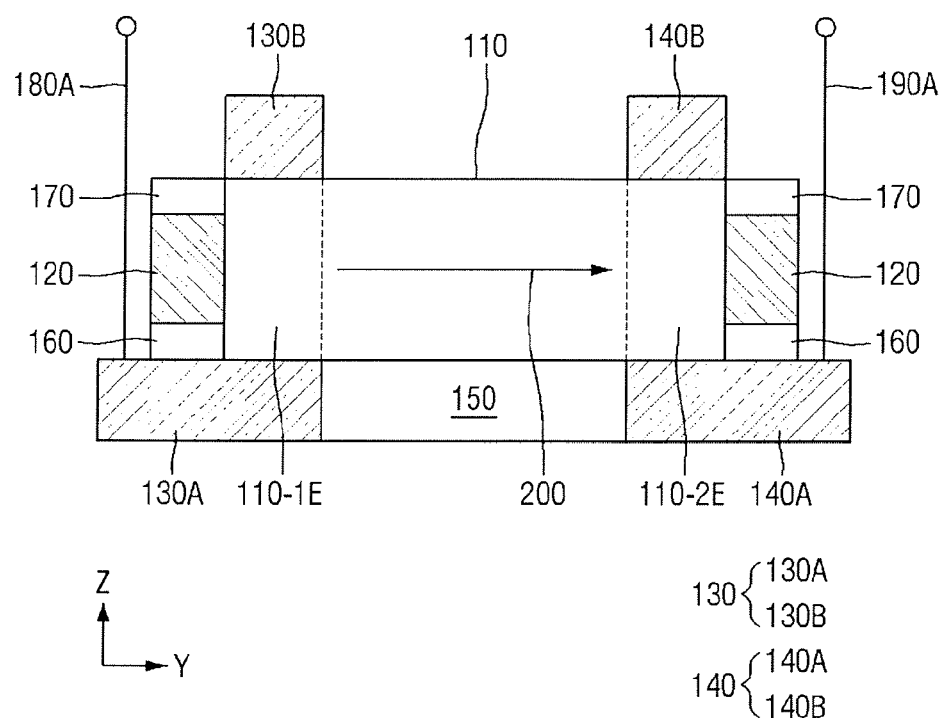
FIGS. 6 and 7 show an electrode connection using cross-sectional views taken along lines A-A and B-B of FIG. 1, respectively, according to an exemplary embodiment of the present inventive concept.
Figure 7:
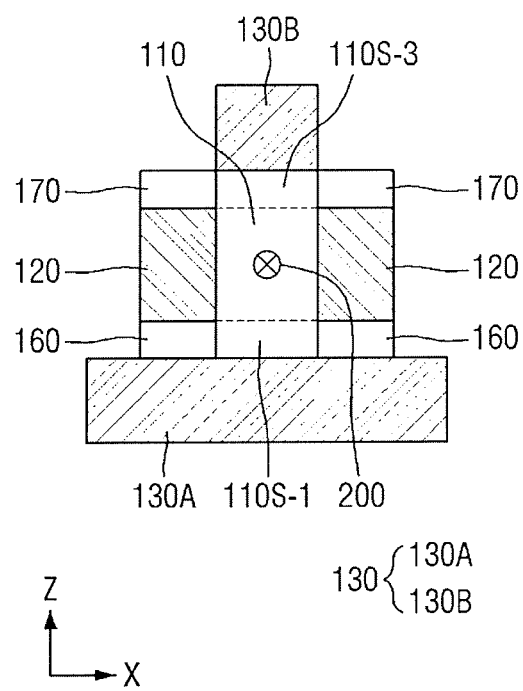

FIGS. 6 and 7 show cross-sectional views of a V-FinFET 100B taken along lines A-A and B-B of FIG. 1 according to an exemplary embodiment of the present inventive concept. When the V-FinFET 100B turns on, a current 200 flows from the lower drain 130A through the first end portion 110-1E and the second end portion 110-2E to the lower source 140A.

In the V-FinFET 100B, a drain electrode 180A is electrically connected to the lower drain 130A; and a source electrode 190A is electrically connected to the lower source 140A. In this case, the drain electrode 180A is not electrically connected to the upper drain 130B; and the source electrode 190A is not electrically connected to the upper source 140B.

The V-FinFET 100A further includes a lower spacer 160 and an upper spacer 170 which are not shown in FIG. 1 for the convenience of description. The lower spacer 160 wraps around the lower sidewall region 110S-1 of the fin structure 110 so that the lower spacer 160 is interposed between the lower drain 130A and the gate electrode 120 to prevent an electrical shortage between the lower drain 130A and the gate electrode 120. The lower spacer 160 is also interposed between the lower source 140A and the gate electrode 120 to prevent an electrical shortage between the lower source 140A and the gate electrode 120.

The upper spacer 170 wraps around the upper sidewall region 110S-3 of the fin structure 110 so that the upper spacer 170 is interposed between the upper drain 130B and the gate electrode 120 to prevent an electrical shortage between the upper drain 130B and the gate electrode 120. The upper spacer 170 is also interposed between the upper source 140B and the gate electrode 120 to prevent an electrical shortage between the upper source 140B and the gate electrode 120.

In this case, the lower drain 130A only serves as a drain of the V-FinFET 100B; and the lower source 140A only serves as a source of the V-FinFET 100B.

The lower drain 130A, the lower spacer 160, the gate electrode 120 and the upper spacer 170 are vertically stacked on each other in the listed order.

The lower drain 130A, the first end portion 110-1E of the fin structure 110 and the upper drain 130B are vertically stacked on each other in the listed order. In this case, the upper drain 130B does not serve as a part of the drain for the V-FinFET 110B.

The lower source 140A, the lower spacer 160, the gate electrode 120 and the upper spacer 170 are vertically stacked on each other in the listed order.

The lower source 140A, the second end portion 110-2E of the fin structure 110 and the upper source 140B are vertically stacked on each other in the listed order. In this case, the upper source 140B does not serve as a part of the source for the V-FinFET 110B.

Figure 8:
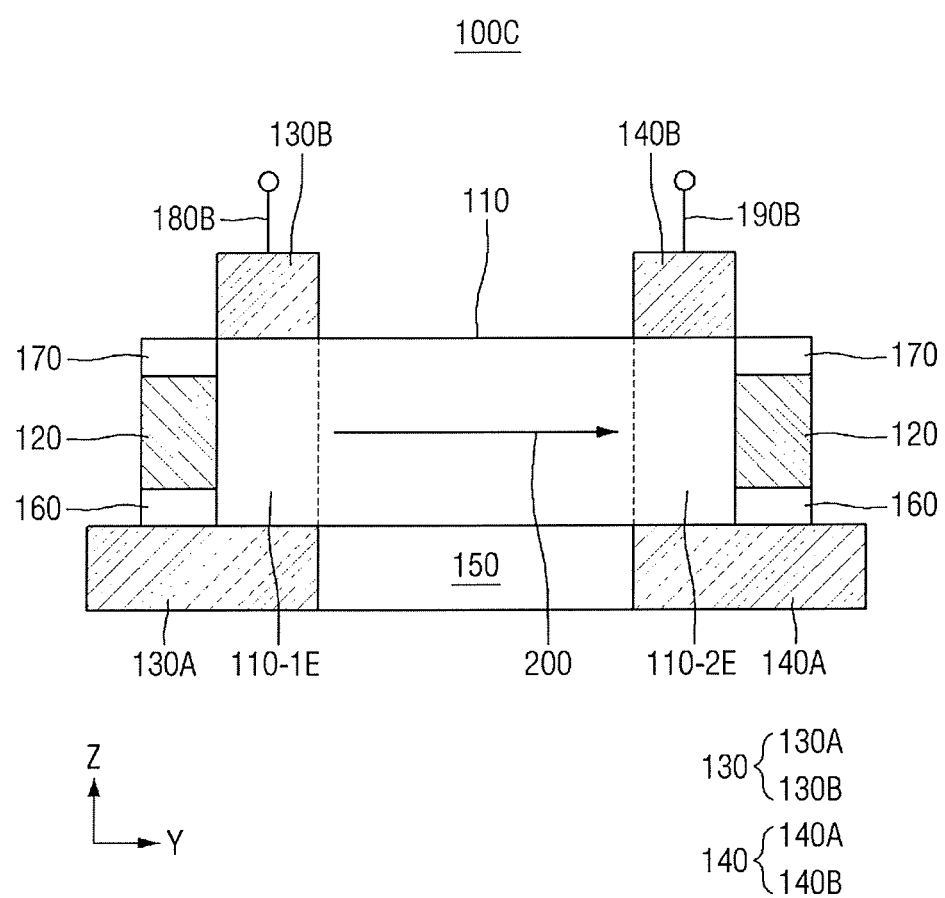
FIGS. 8 and 9 show an electrode connection using cross-sectional views taken along lines A-A and B-B of FIG. 1, respectively, according to an exemplary embodiment of the present inventive concept.
Figure 9:
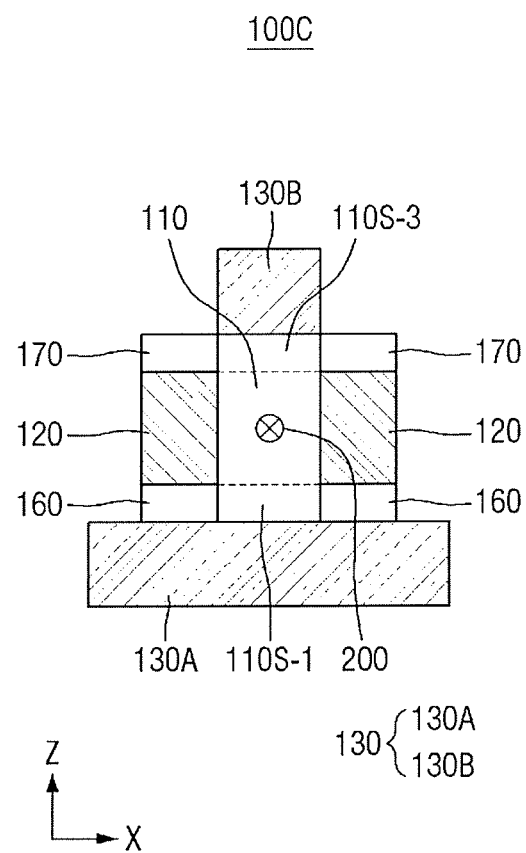

FIGS. 8 and 9 show cross-sectional views of a V-FinFET 100C taken along lines A-A and B-B of FIG. 1 according to an exemplary embodiment of the present inventive concept. When the V-FinFET 100C turns on, a current 200 flows from the upper drain 130B through the first end portion 110-1E and the second end portion 110-2E to the upper source 140B.

In the V-FinFET 100C, a drain electrode 180B is electrically connected to the upper drain 130B; and a source electrode 190B is electrically connected to the upper source 140B. In this case, the drain electrode 180B is not electrically connected to the lower drain 130A; and the source electrode 190B is not electrically connected to the lower source 140A.

The V-FinFET 100C further includes a lower spacer 160 and an upper spacer 170 which are not shown in FIG. 1 for the convenience of description. The lower spacer 160 wraps around the lower sidewall region 110S-1 of the fin structure 110 so that the lower spacer 160 is interposed between the lower drain 130A and the gate electrode 120 to prevent an electrical shortage between the lower drain 130A and the gate electrode 120. The lower spacer 160 is also interposed between the lower source 140A and the gate electrode 120 to prevent an electrical shortage between the lower source 140A and the gate electrode 120. In this case, the lower source 140A does not serve as a source of the V-FinFET 100C; the lower drain 130A does not serve as a drain of the V-FinFET 100C.

The upper spacer 170 wraps around the upper sidewall region 110S-3 of the fin structure 110 so that the upper spacer 170 is interposed between the upper drain 130B and the gate electrode 120 to prevent an electrical shortage between the upper drain 130B and the gate electrode 120. The upper spacer 170 is also interposed between the upper source 140B and the gate electrode 120 to prevent an electrical shortage between the upper source 140B and the gate electrode 120.

In this case, the upper drain 130B only serves as a drain; and the upper source 140B only serves as a source.

The lower drain 130A, the lower spacer 160, the gate electrode 120 and the upper spacer 170 are vertically stacked on each other in the listed order.

The lower drain 130A, the first end portion 110-1E of the fin structure 110 and the upper drain 130B are vertically stacked on each other in the listed order. In this case, the lower drain 130A does not serve as a part of the drain for the V-FinFET 110C.

The lower source 140A, the lower spacer 160, the gate electrode 120 and the upper spacer 170 are vertically stacked on each other in the listed order.

The lower source 140A, the second end portion 110-2E of the fin structure 110 and the upper source 140B are vertically stacked on each other in the listed order. In this case, the lower source 140A does not serve as a part of the source for the V-FinFET 110C.

Figure 10:
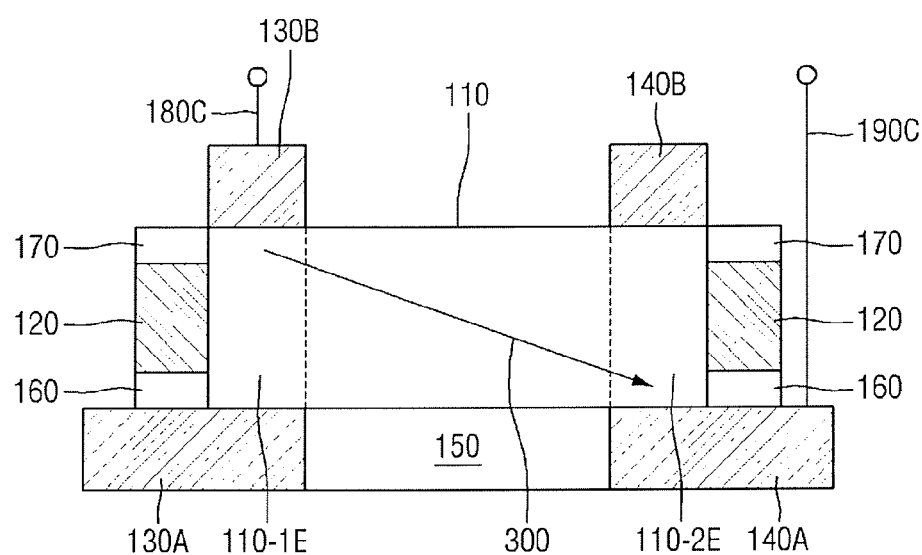
FIGS. 10 and 11 show an electrode connection using cross-sectional views taken along lines A-A and B-B of FIG. 1, respectively, according to an exemplary embodiment of the present inventive concept.
Figure 11:
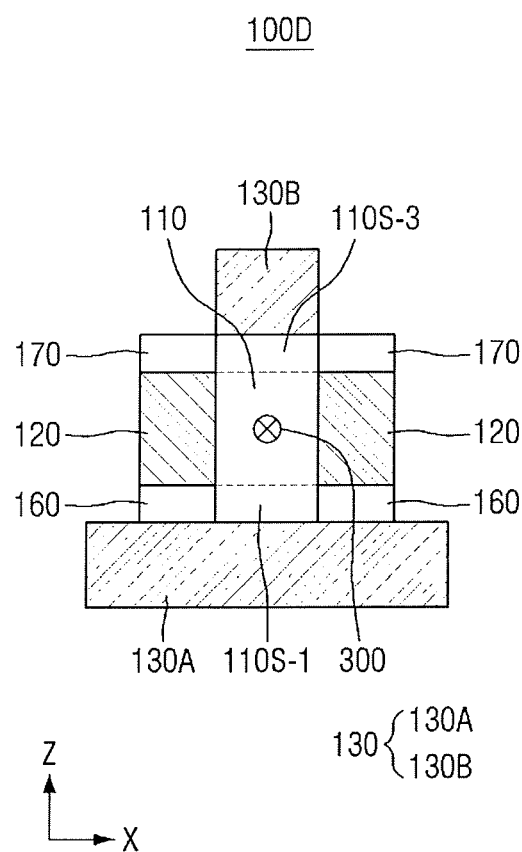

FIGS. 10 and 11 show cross-sectional views of a V-FinFET 100D taken along lines A-A and B-B of FIG. 1 according to an exemplary embodiment of the present inventive concept. When the V-FinFET 100D turns on, a current 300 flows diagonally from the upper drain 130B through the first end portion 110-1E and the second end portion 110-2E to the lower source 140A. For example, the current 300 flows diagonally from the upper drain 130B to the lower source 140A.

In the V-FinFET 100D, a drain electrode 180C is electrically connected to the upper drain 130B; and a source electrode 190C is electrically connected to the lower source 140A. In this case, the drain electrode 180C is not electrically connected to the lower drain 130A; and the source electrode 190C is not electrically connected to the upper source 140B.

The V-FinFET 100D further includes a lower spacer 160 and an upper spacer 170 which are not shown in FIG. 1 for the convenience of description. The lower spacer 160 wraps around the lower sidewall region 110S-1 of the fin structure 110 so that the lower spacer 160 is interposed between the lower drain 130A and the gate electrode 120 to prevent an electrical shortage between the lower drain 130A and the gate electrode 120. The lower spacer 160 is also interposed between the lower source 140A and the gate electrode 120 to prevent an electrical shortage between the lower source 140A and the gate electrode 120.

The upper spacer 170 wraps around the upper sidewall region 110S-3 of the fin structure 110 so that the upper spacer 170 is interposed between the upper drain 130B and the gate electrode 120 to prevent an electrical shortage between the upper drain 130B and the gate electrode 120. The upper spacer 170 is also interposed between the upper source 140B and the gate electrode 120 to prevent an electrical shortage between the upper source 140B and the gate electrode 120.

In this case, the upper drain 130B only serves as a drain of the V-FinFET 100D; and the lower source 140A only serves as a source of the V-FinFET 100D.

The lower drain 130A, the lower spacer 160, the gate electrode 120 and the upper spacer 170 are vertically stacked on each other in the listed order. In this case, the lower drain 130A does not serve as a part of the drain for the V-FinFET 110D.

The lower drain 130A, the first end portion 110-1E of the fin structure 110 and the upper drain 130B are vertically stacked on each other in the listed order. In this case, the lower drain 130A does not serve as a part of the drain for the V-FinFET 110D.

The lower source 140A, the lower spacer 160, the gate electrode 120 and the upper spacer 170 are vertically stacked on each other in the listed order.

The lower source 140A, the second end portion 110-2E of the fin structure 110 and the upper source 140B are vertically stacked on each other in the listed order. In this case, the upper source 140B does not serve as a part of the source for the V-FinFET 110D.

Figure 12:
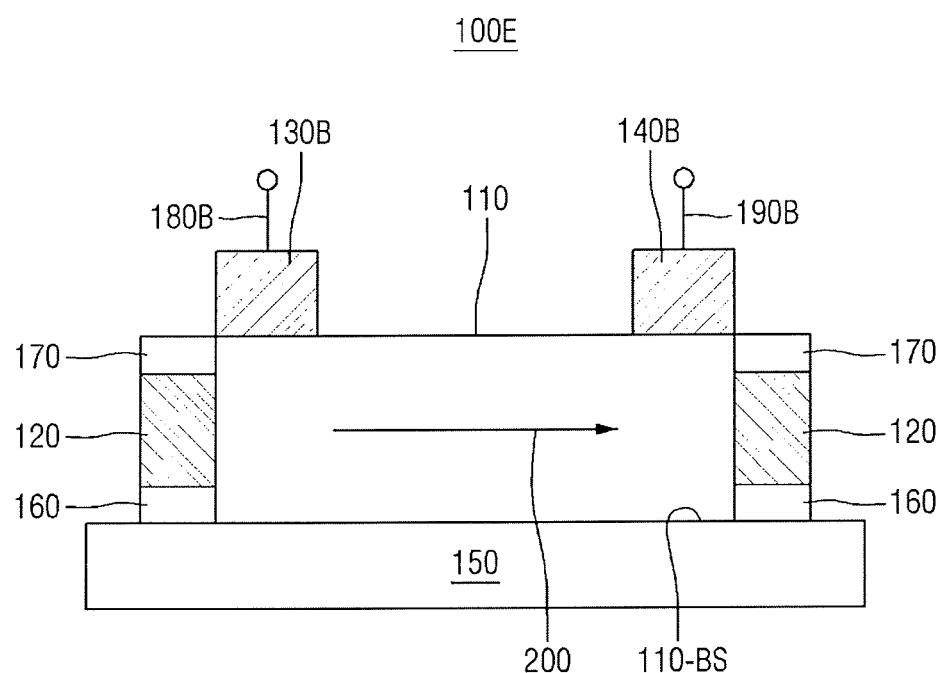
FIGS. 12 and 13 show an electrode connection using cross-sectional views taken along lines A-A and B-B of FIG. 1, respectively, according to an exemplary embodiment of the present inventive concept.
Figure 13:
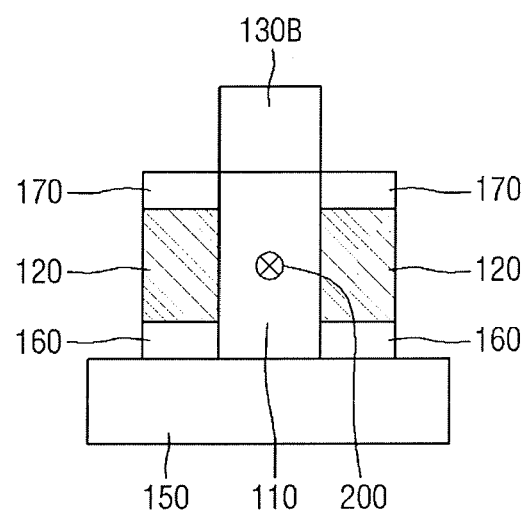

FIGS. 12 and 13 show cross-sectional views of a V-FinFET 100E taken along lines A-A and B-B of FIG. 1 according to an exemplary embodiment of the present inventive concept. In this case, the lower drain 130A and the lower source 140A of FIG. 1 are not formed in the substrate 150 and thus the bottom surface 110_BS of the fin structure 110 is in contact with an upper surface of the substrate 150.

The V-FinFET 100E is substantially similar to the V-FinFET 100C of FIGS. 8 and 9, except that the lower drain 130A and the lower source 140A are not formed in the V-FinFET 100E of FIGS. 12 and 13. The other elements of the V-FinFET 100E are substantially the same as the other elements of the V-FinFET 100C of FIGS. 8 and 9. Accordingly, the description of the same elements are omitted for the convenience of description.

Figure 15:
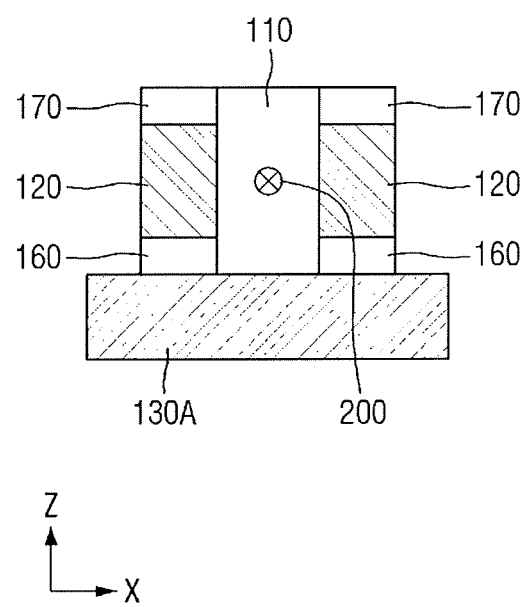

FIGS. 14 and 15 show cross-sectional views of a V-FinFET 100F taken along lines A-A and B-B of FIG. 1 according to an exemplary embodiment of the present inventive concept. In this case, the upper drain 130B and the upper source 140B of FIG. 1 are not formed on the fin structure 110.

The V-FinFET 100F is substantially similar to the V-FinFET 100B of FIGS. 6 and 7, except that the upper drain 130B and the upper source 140B of the V-FinFET 100B are not formed in the V-FinFET 100F of FIGS. 14 and 15. The other elements of the V-FinFET 100F are substantially the same with the other elements of the V-FinFET 100B of FIGS. 6 and 7. Accordingly, the description of the same elements are omitted for the convenience of description.

Figure 16:
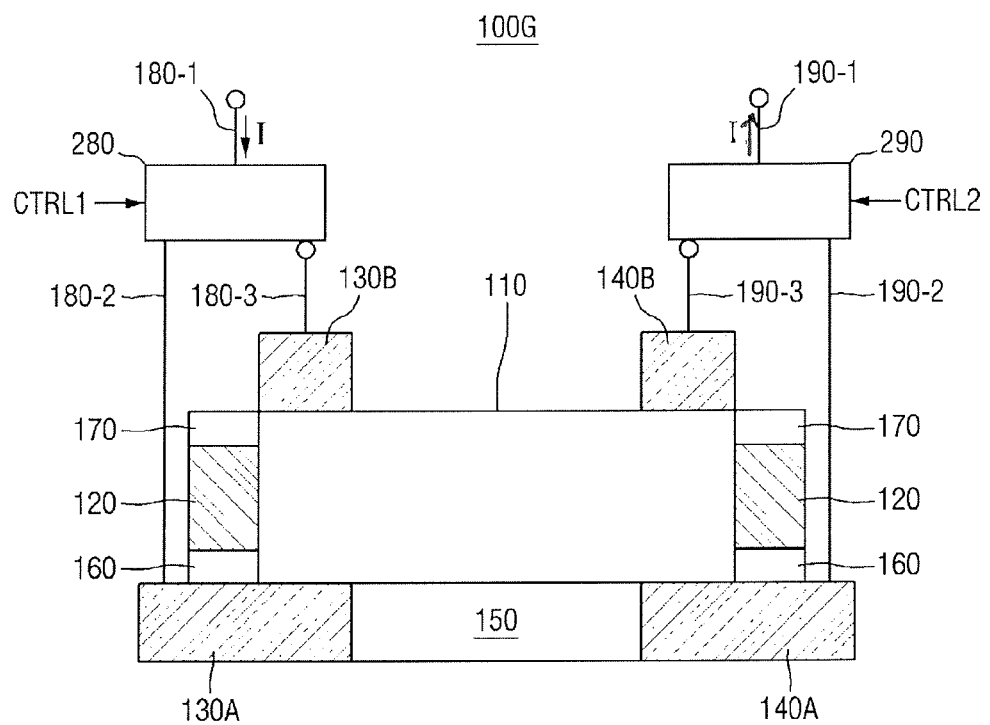
FIG. 16 shows a V-FinFET 100G according to an exemplary embodiment of the present inventive concept.

FIG. 16 shows a V-FinFET 100G according to an exemplary embodiment of the present inventive concept. The cross-sectional view of the V-FinFET 100G is similar to the cross-sectional view of the V-FinFET 100A, except that the V-FinFET 100G includes a drain electrode switch 280 and a source electrode switch 290.

The drain electrode 180 includes a main drain electrode 180-1, a first sub drain electrode 180-2 and a second sub drain electrode 180-3. The drain electrode switch 280 receives a current I through the main drain electrode 180-1 and outputs the current I to at least one of the first sub drain electrode 180-2 and the second sub drain electrode 180-3 in response to a drain control signal CTRL1. Depending on the drain control signal CTRL1, various connections between the lower drain 130A, the upper drain 130B, the lower source 140A and the upper source 140B as shown in FIGS. 2 to 11 are formed by independently controlling the drain electrode switch 280 and the source electrode switch 290.

The drain electrode switch 280 is connected to the main drain electrode 180-1 as an input and to the first and second sub drain electrodes 180-2 and 180-3 as outputs. The source electrode switch 290 is connected to the first and second sub source electrodes 190-2 and 190-3 as inputs and to the main source electrode 190-1 as an output.

The drain electrode switch 280 may, in response to the drain control signal CTRL1, select the first and second sub drain electrodes 180-2 and 180-3 and the source electrode switch 290 may, in response to the source control signal CTRL2, select the first and second sub source electrodes 190-2 and 190-3. In this case, the main drain electrode 180-1, the first and second sub drain electrode 180-2 and 180-3 and the drain electrode switch 280 serve as the drain electrode 180 of FIG. 2; the main source electrode 190-1, the first and second source electrodes 190-2 and 190-3 and the source electrode switch 290 serve as the source electrode 190 of FIG. 4.

The drain electrode switch 280 may, in response to the drain control signal CTRL1, select the first sub drain electrode 180-2 only and the source electrode switch 290 may, in response to the source control signal CTRL2, select the second sub source electrode 190-3 only. In this case, the main drain electrode 180-1, the first sub drain electrode 180-2 and the drain electrode switch 280 serve as the drain electrode 180A of FIG. 6; the main source electrode 190-1, the second source electrode 190-3 and the source electrode switch 290 serve as the source electrode 190A of FIG. 6.

The drain electrode switch 280 may, in response to the drain control signal CTRL1, select the second sub drain electrode 180-3 only and the source electrode switch 290 may, in response to the source control signal CTRL2, select the first sub source electrode 190-2 only. In this case, the main drain electrode 180-1, the second sub drain electrode 180-3 and the drain electrode switch 280 serve as the drain electrode 180B of FIG. 8; the main source electrode 190-1, the first source electrode 190-2 and the source electrode switch 290 serve as the source electrode 190B of FIG. 8.

The drain electrode switch 280 may, in response to the drain control signal CTRL1, select the second sub drain electrode 180-3 only and the source electrode switch 290 may, in response to the source control signal CTRL2, select the second sub source electrode 190-3 only. In this case, the main drain electrode 180-1, the second sub drain electrode 180-3 and the drain electrode switch 280 serve as the drain electrode 180C of FIG. 10; the main source electrode 190-1, the second sub source electrode 190-3 and the source electrode switch 290 serve as the source electrode 190C of FIG. 10.

Figure 17:
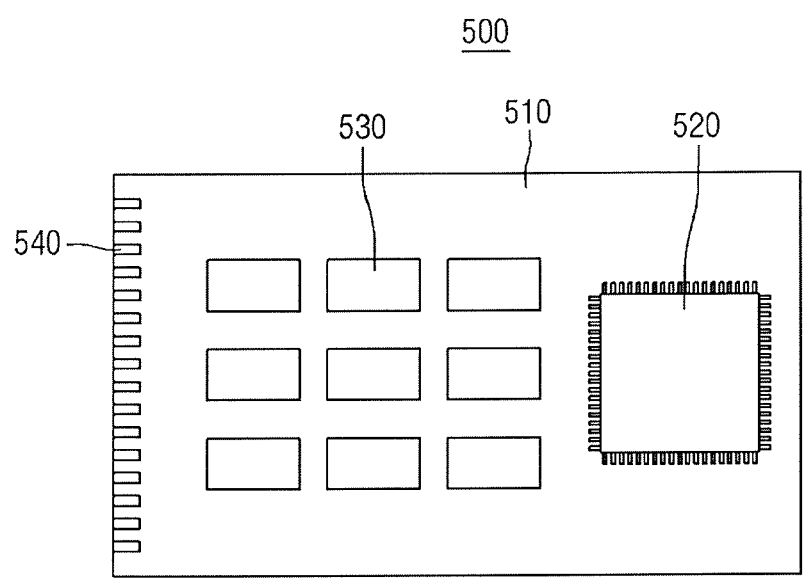
FIG. 17 is a semiconductor module having a V-FinFET according to an exemplary embodiment of the present inventive concept.

FIG. 17 is a semiconductor module having a semiconductor device according to an exemplary embodiment of the present inventive concept.

Referring to FIG. 17, the semiconductor module 500 includes a semiconductor device 530. The semiconductor device 530 may be formed according to an exemplary embodiment of the present inventive concept. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 18:
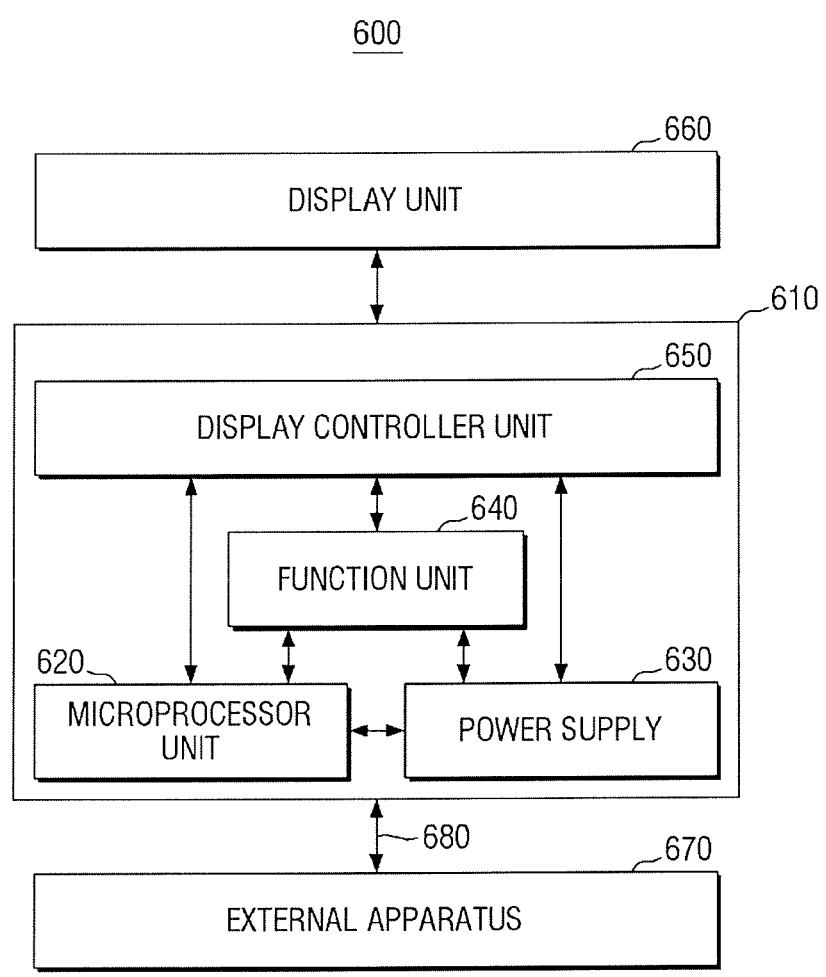
FIG. 18 is a block diagram of an electronic system having a V-FinFET according to an exemplary embodiment of the present inventive concept.

FIG. 18 is a block diagram of an electronic system having a semiconductor device according to an exemplary embodiment of the present inventive concept.

Referring to FIG. 18, a semiconductor device fabricated according to an exemplary embodiment of the present inventive concept may be included in an electronic system 600. The electronic system 600 includes a body 610, a microprocessor unit 620, a power supply 630, a function unit 640, and a display controller unit 650. The body 610 may include a system board or a motherboard having a printed circuit board (PCB) or the like. The microprocessor unit 620, the power supply 630, the function unit 640, and the display controller unit 650 are mounted or disposed on the body 610. A display unit 660 may be stacked on an upper surface of the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. In an exemplary embodiment, if the electronic system 600 is connected to a memory card to expand the storage capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 19:
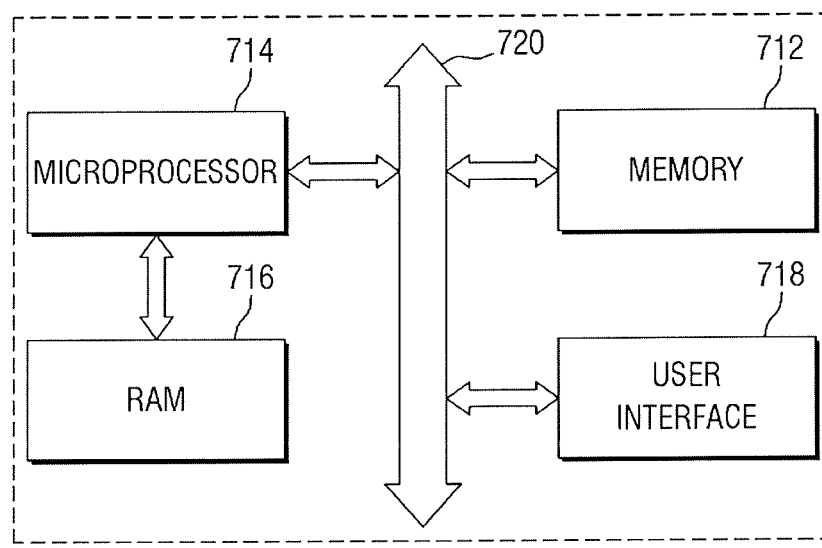
FIG. 19 is a block diagram of an electronic system having a V-FinFET according to an exemplary embodiment of the present inventive concept.

FIG. 19 is a block diagram of an electronic system having a semiconductor device according to an exemplary embodiment of the present inventive concept.

Referring to FIG. 19, the electronic system 700 may be included in a mobile device or a computer. For example, the electronic system 700 includes a memory system 712, a microprocessor 714, a random access memory (RAM) 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A vertical field effect transistor, comprising:
   a substrate having a lower drain and a lower source arranged along a first direction in parallel to an upper surface of the substrate;
   a fin structure disposed on the substrate and extended vertically from the upper surface of the substrate, wherein the fin structure includes a first end portion and a second end portion arranged along the first direction, wherein a bottom surface of a first end portion of the fin structure and a bottom surface of a second end portion of the fin structure overlap the lower drain and the lower source, respectively, and wherein the fin structure includes a sidewall having a lower sidewall region, a center sidewall region and an upper sidewall region; and
   a gate electrode surrounding the center sidewall region of the fin structure.

2. The vertical field effect transistor of claim 1, wherein the gate electrode is spaced apart from the upper surface of the substrate.

3. The vertical field effect transistor of claim 2, further comprising:
   an upper spacer surrounding the upper sidewall region of the fin structure; and
   a lower spacer surrounding the lower sidewall region of the fin structure,
   wherein the gate electrode is interposed between the lower spacer and the upper spacer.

4. The vertical field effect transistor of claim 1, wherein the bottom surface of the first end portion and the bottom surface of the second end portion of the fin structure are in contact with the lower drain and the lower source, respectively.

5. The vertical field effect transistor of claim 3, further comprising:
   an upper drain disposed on the first end portion of the fin structure; and
   an upper source disposed on the second end portion of the fin structure, wherein the upper source, the second end portion of the fin structure and the lower source are stacked on each other vertically from the upper surface of the substrate.

6. The vertical field effect transistor of claim 5,
   wherein the upper drain is not overlapped with the upper spacer and
   wherein the upper source is not overlapped with the upper spacer.

7. The vertical field effect transistor of claim 5,
   wherein the upper drain, the first end portion, and the lower drain are stacked on each other vertically from the upper surface of the substrate.

8. The vertical field effect transistor of claim 5, further comprising:
   a source electrode connected to the lower source and the upper source; and
   a drain connection electrode connected to the lower drain and the upper drain.

9. The vertical field effect transistor of claim 5, further comprising:
   a source electrode connected to the lower source; and
   a drain electrode connected to the lower drain.

10. The vertical field effect transistor of claim 5, further comprising:
    a source electrode connected to the upper source; and
    a drain electrode connected to the upper drain.

11. The vertical field effect transistor of claim 5, further comprising:
    a source electrode connected to the lower source; and
    a drain electrode connected to the upper drain.

12. A vertical field effect transistor, comprising:
    a substrate;
    a fin structure disposed on the substrate, wherein the fin structure includes a first end portion and a second end portion arranged along a first direction in parallel to an upper surface of the substrate and wherein the fin structure is extended vertically from the upper surface of the substrate and includes a sidewall having a lower sidewall region, a center sidewall region and an upper sidewall region;
    an upper drain disposed on an upper surface of the first end portion of the fin structure;
    an upper source disposed on an upper surface of the second end portion of the fin structure; and
    a gate electrode surrounding the center sidewall region of the fin structure,
    wherein the sidewall is divided into the lower sidewall region, the center sidewall region and the upper sidewall region in a second direction that is perpendicular to the upper surface of the substrate.

13. The vertical field effect transistor of claim 12, further comprising:
    an upper spacer surrounding the upper sidewall region of the fin structure; and
    a lower spacer surrounding the lower sidewall region of the fin structure,
    wherein the gate electrode is interposed between the lower spacer and the upper spacer.

14. The vertical field effect transistor of claim 13,
    wherein the upper source and the upper drain are not overlapped with the upper spacer.

15. The vertical field effect transistor of claim 12, further comprising:
    a source electrode connected to the upper source; and
    a drain electrode connected to the upper drain.

* * * * *